United States Patent [19]
Pax et al.

[11] Patent Number: 5,982,237
[45] Date of Patent: *Nov. 9, 1999

[54] DIGITAL CLOCK RECOVERY LOOP

[75] Inventors: George E. Pax; James E. O'Toole, both of Boise, Id.; Dan M. Griffin, Bountiful, Utah

[73] Assignee: Micron Communications, Inc., Boise, Id.

[*] Notice: This patent is subject to a terminal disclaimer.

[21] Appl. No.: 09/005,090

[22] Filed: Jan. 9, 1998

Related U.S. Application Data

[63] Continuation of application No. 08/707,220, Aug. 29, 1996, Pat. No. 5,774,022.

[51] Int. Cl.⁶ .............................. H03L 1/00; H03L 7/89; H03L 7/18
[52] U.S. Cl. .............................. 331/1 A; 331/4; 331/17; 331/25; 327/157; 327/159; 375/376
[58] Field of Search .................................. 331/1 A, 4, 17, 331/25; 327/157, 159; 375/376

[56] References Cited

U.S. PATENT DOCUMENTS

| | | | |
|---|---|---|---|
| 4,075,632 | 2/1978 | Baldwin et al. | 343/6.8 |
| 4,572,976 | 2/1986 | Fockens | 327/47 |
| 4,724,427 | 2/1988 | Carroll | 340/572.1 |
| 4,854,328 | 8/1989 | Pollack | 600/549 |
| 4,857,893 | 8/1989 | Carroll | 340/572.7 |
| 4,862,160 | 8/1989 | Ekchian et al. | 340/825.54 |

(List continued on next page.)

OTHER PUBLICATIONS

U.S. Patent Application Serial No. 08/705,043, filed Aug. 29, 1996.
U.S. Patent Application Serial No. 08/708,164, filed Aug. 29, 1996.
U.S. Patent Application Serial No. 08/704,965, filed Aug. 29, 1996.

"CMOS Analog Integrated Circuits Based on Weak Inversion Operation", by Eric Vittoz and Jean Fellrath, IEEE Journal of Solid State Circuits, vol. SC–12, No. 3, Jun. 1977.

"Digital RF/ID Enhances GPS", by John R. Tuttle, Proceedings of the Second Annual Wireless Symposium, pp. 406–411, Feb. 15–18, 1994, Santa Clara, CA.

"Micron Morning Report", The Idaho Statesman, Jul. 16, 1993.

"A Low–Power Spread Spectrum CMOS RFIC for Radio Identification Applications", by John R. Tuttle, Conference Proceedings from RF Expo West, pp. 216–222, Mar. 22–24, 1994, San Jose, CA.

Primary Examiner—Arnold Kinkead
Attorney, Agent, or Firm—Wells, St. John, Roberts, Gregory & Matkin, P.S.

[57] ABSTRACT

A communications system including a clock recovery circuit that extracts a clock signal from incoming digital data, the clock recovery circuit comprising:
a voltage controlled oscillator having a control node and having an output producing an output wave having a frequency that varies in response to a voltage applied to the control node; charge pump and loop filter circuitry that controls the rate of change of the voltage on the control node of the voltage controlled oscillator; a start-up circuit that performs frequency detection and, in conjunction with the charge pump and loop filter circuitry, adjusts the voltage on the control node of the voltage controlled oscillator; and a state machine that performs phase detection and adjusts the voltage on the control node of the voltage controlled oscillator.

18 Claims, 13 Drawing Sheets

U.S. PATENT DOCUMENTS

| | | | |
|---|---|---|---|
| 4,870,419 | 9/1989 | Baldwin et al. | 342/51 |
| 4,888,591 | 12/1989 | Landt et al. | 342/44 |
| 4,890,072 | 12/1989 | Espe et al. | 331/11 |
| 4,912,471 | 3/1990 | Tyburski et al. | 342/42 |
| 4,926,182 | 5/1990 | Ohta et al. | 342/44 |
| 5,086,389 | 2/1992 | Hassett et al. | 705/13 |
| 5,134,085 | 7/1992 | Gilgen et al. | 438/210 |
| 5,144,314 | 9/1992 | Malmberg et al. | 342/44 |
| 5,164,985 | 11/1992 | Nysen et al. | 380/9 |
| 5,175,774 | 12/1992 | Truax et al. | 382/145 |
| 5,272,367 | 12/1993 | Dennison et al. | 257/306 |
| 5,287,112 | 2/1994 | Schuermann | 342/42 |
| 5,300,875 | 4/1994 | Tuttle | 320/138 |
| 5,323,150 | 6/1994 | Tuttle | 340/825.54 |
| 5,365,551 | 11/1994 | Snodgrass et al. | 375/200 |
| 5,374,930 | 12/1994 | Schuermann | 342/42 |
| 5,406,263 | 4/1995 | Tuttle | 340/572.1 |
| 5,420,757 | 5/1995 | Eberhardt et al. | 361/813 |
| 5,422,603 | 6/1995 | Soyuer | 331/1 A |
| 5,448,242 | 9/1995 | Sharpe et al. | 342/42 |
| 5,455,540 | 10/1995 | Williams | 331/1 A |
| 5,461,385 | 10/1995 | Armstrong | 342/42 |
| 5,471,212 | 11/1995 | Sharpe et al. | 342/51 |
| 5,489,546 | 2/1996 | Ahmad et al. | 438/200 |
| 5,500,650 | 3/1996 | Snodgrass et al. | 342/42 |
| 5,530,383 | 6/1996 | May | 327/39 |
| 5,577,086 | 11/1996 | Fujimoto et al. | 375/376 |
| 5,621,412 | 4/1997 | Sharpe et al. | 342/51 |
| 5,649,296 | 7/1997 | MacLellan et al. | 455/38.2 |
| 5,774,022 | 6/1998 | Griffin et al. | 331/1 A |

| ENABLE | TX | PRESENT STATE Q1 | PRESENT STATE Q0 | NEXT STATE D1 | NEXT STATE D0 |
|---|---|---|---|---|---|
| 0 | 0 | 0 | 0 | 0 | 0 |
| 0 | 1 | 0 | 0 | 0 | 0 |
| 1 | 0 | 0 | 0 | 1 | 0 |
| 1 | 1 | 0 | 0 | 0 | 1 |
| X | 0 | 0 | 1 | 0 | 0 |
| X | 1 | 1 | 1 | 0 | 1 |
| X | X | 1 | 1 | 0 | 1 |
| X | 0 | 1 | 0 | 1 | 1 |
| X | 1 | 1 | 0 | 0 | 1 |

|  En TX \ Q1 Q0 | 00 | 01 | 11 | 10 |
|---|---|---|---|---|
| 00 | 0 | 0 | 1 | 1 |
| 01 | 0 | 1 | 1 | 1 |
| 11 | 1 | 1 | 1 | 1 |
| 10 | 0 | 0 | 1 | 1 |

|  En TX \ Q1 Q0 | 00 | 01 | 11 | 10 |
|---|---|---|---|---|
| 00 | 0 | 0 | 0 | 1 |
| 01 | 0 | 0 | 0 | 0 |
| 11 | 0 | 0 | 0 | 0 |
| 10 | 1 | 0 | 0 | 1 |

Fig. 8

| NAME | CURRENT (μA) | ΔV (mV) | ΔV/V CONTROL(NOM) × 100 |
|---|---|---|---|
| COARSE | 40 | 160 | 13.3% |
| MEDIUM | 10 | 40 | 3.3 |
| MEDIUM FINE | 1 | 2.6 | 0.22 |
| FINE | 0.1 | 0.26 | 0.022 |

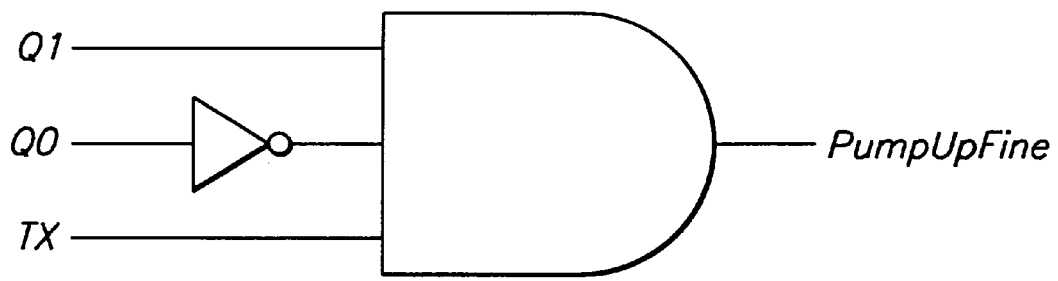
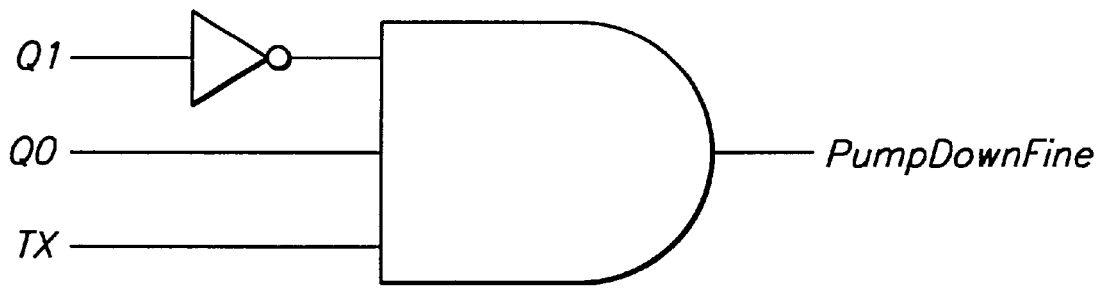
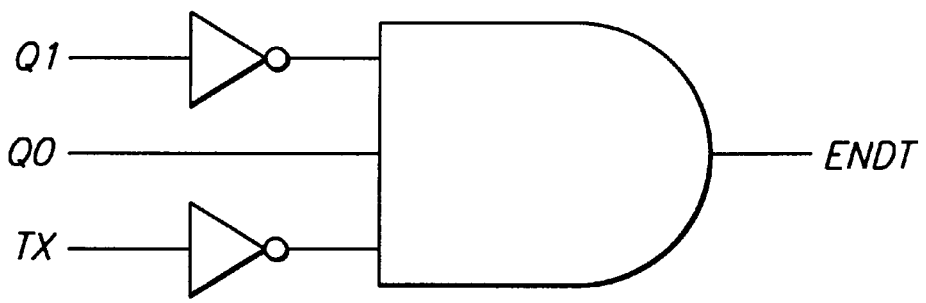
Fig. 15

DIGITAL CLOCK RECOVERY LOOP

CROSS REFERENCE TO RELATED APPLICATION

This is a Continuation of U.S. patent application Ser. No. 08/707,220, filed Aug. 29, 1996, now U.S. Pat. No. 5,774,022 and titled "Digital Clock Recovery Loop".

TECHNICAL FIELD

This invention relates to communications systems. More particularly, the invention relates to phase locked loops employed in communications systems.

BACKGROUND OF THE INVENTION

Phase locked loops are known in the art. A phase locked loop is a circuit containing an oscillator whose output phase and/or frequency is steered to keep it in synchronization with some reference signal. A phase locked loop typically includes a phase comparator having a first input receiving an input reference signal, having a second input, and having an output, a filter having an input receiving the output of the phase comparator and having an output, an amplifier having an input receiving the output of the filter, and having an output defining the output of the phase locked loop, and a voltage controlled oscillator having an input receiving a control voltage from the amplifier and having an output connected to the second input of the phase comparator.

Phase locked loops have various applications. In many communications systems, for example, it is necessary to recover a clock signal from the received data. A phase locked loop is one way of recovering such a clock signal.

SUMMARY OF THE INVENTION

The invention provides a digital clock recovery loop. The digital clock recovery loop includes a voltage controlled oscillator. The voltage controlled oscillator has an output, and produces a square wave at output having a frequency controlled by the voltage on an input control node. In one embodiment, only one control node is employed; however, the illustrated embodiment, a differential control node scheme is employed involving two control nodes. Therefore, in the illustrated embodiment, a capacitor is provided on each control node, and control voltages are stored in analog form on these two capacitors. When the voltage on the control node is zero, the frequency at output is at least one half of the final recovered frequency and not greater than the final recovered frequency. The output frequency rises monotonically, nearly linearly, as the control node voltage is increased.

The digital clock recovery loop further includes a charge pump and loop filters which control the rate of change of the voltage on the control node of the voltage controlled oscillator.

The digital clock recovery loop further includes a start-up circuit which performs frequency detection when the voltage controlled oscillator first starts up and, in conjunction with the charge pump and loop filters, causes the voltage on the control node of the voltage controlled oscillator to change rapidly.

The digital clock recovery loop further includes a state machine which performs phase detection when the frequency of the voltage controlled oscillator is within a few percent of its final value and, in conjunction with the charge pump and loop filters, causes the voltage on the control node of the voltage controlled oscillator to change slowly.

The only analog blocks are the voltage controlled oscillator and the charge pump. The rest of the circuits of the digital clock recovery loop are digital circuits which are easy to build at high yield in integrated circuit processes.

BRIEF DESCRIPTION OF THE DRAWINGS

Preferred embodiments of the invention are described below with reference to the following accompanying drawings.

FIGS. 5–10 illustrate steps used in designing a state machine that implements the state diagram of FIG. 4. FIG. 5 illustrates flip-flops having outputs representing in binary form the various states of the state diagrams and having inputs representing next state values. FIG. 6 is a state table. FIGS. 7 and 8 are Karnaugh maps used to derive minimum logic circuitry needed to derive circuit output functions and flip-flop input functions. FIGS. 9 and 10 illustrate logic circuitry that implements the state machine.

FIG. 15 illustrates logic circuitry that is also employed to implement the state machine

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In many communications systems it is necessary to recover a clock signal from the received digital data stream. Typically, a phase locked loop of some type is used to extract the clock. The term "phase locked loop," as used herein, is intended to indicate structure, not a state of operation (such as a loop that has achieved frequency lock).

There are many requirements on the phase locked loop used to recover a clock signal from the received digital data stream. Several important ones for this application are that the phase locked loop must acquire the desired frequency without locking to a multiple or sub-multiple of the desired frequency; the phase locked loop must lock to the desired frequency within a certain time of interest; and the phase locked loop must yield consistent performance despite wide variation in device parameters which is inherent in integrated circuit processing. The phase locked loop employed in the illustrated embodiment, satisfies these requirements.

In the illustrated embodiment, the received digital data stream is encoded for direct sequence spread spectrum. In the illustrated embodiment, a data bit "1" is represented by a thirty-one chip sequence and a data bit "0" is represented by the logical inversion of the same thirty-one chip sequence. Other forms of digital encoding can be employed.

Figure 1:
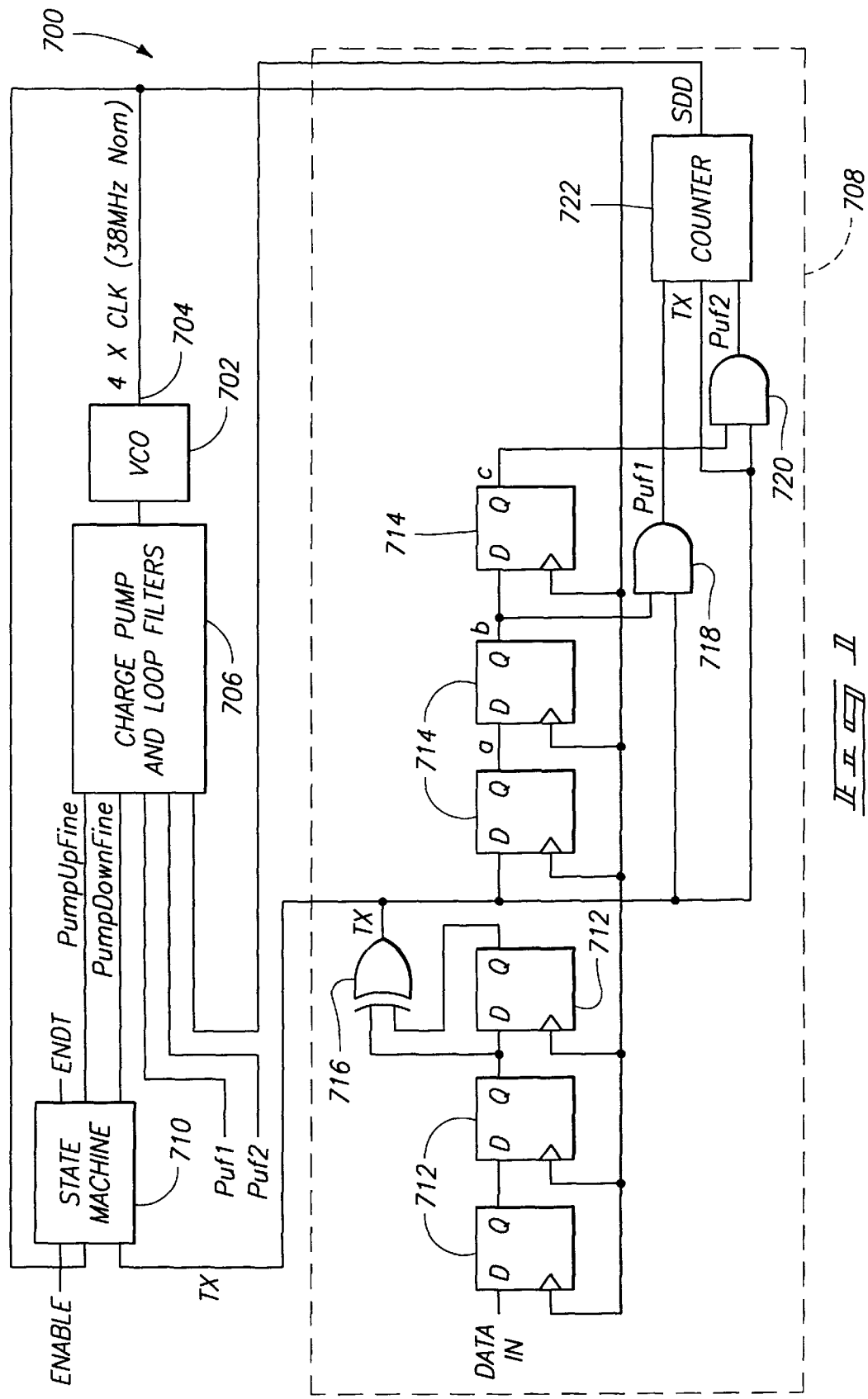
FIG. 1 is a circuit diagram of a digital clock recovery loop embodying the invention.
Figure 2:
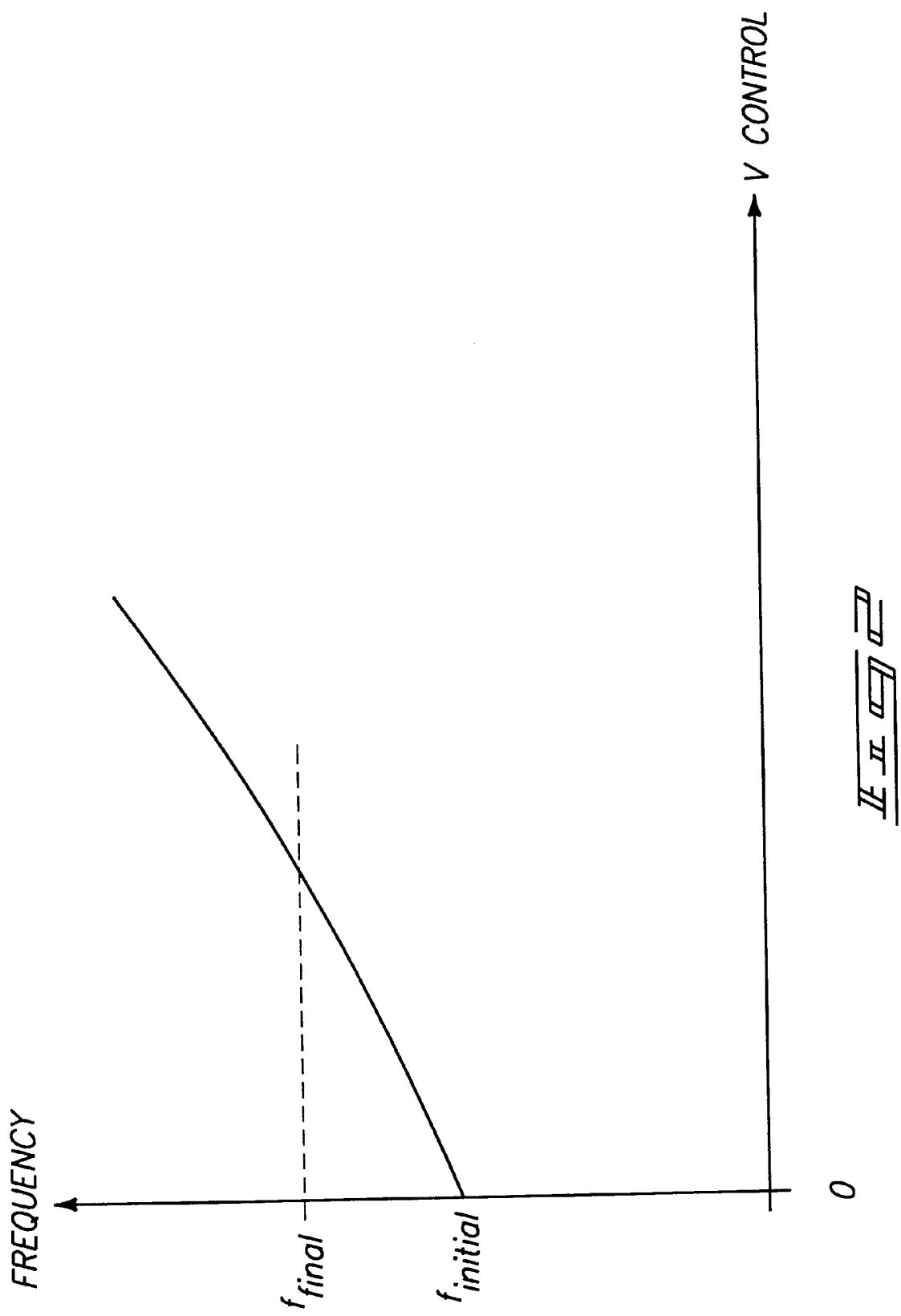
FIG. 2 is a plot of frequency produced by a voltage controlled oscillator versus control voltage applied to the voltage controlled oscillator.

FIG. 1 shows a digital clock recovery loop 700 embodying the invention. The digital clock recovery loop 700 comprises several sub-circuits. The digital clock recovery loop 700 includes a voltage controlled oscillator 702. The voltage controlled oscillator 702 has an output 704, and produces a square wave at output 704 having a frequency controlled by the voltage on an input control node. In one embodiment, only one control node is employed; however, in the illustrated embodiment, a differential control node scheme is employed involving two control nodes "OUTN" and "OUTP" (see FIGS. 14A–B). Therefore, in the illustrated embodiment, a capacitor is provided on each control node, and control voltages are stored in analog form on these two capacitors. When the voltage on the control node is zero, the frequency at output 704 is at least one half of the final recovered frequency and not greater than the final recovered frequency. The output frequency rises monotonically, nearly linearly, as the control node voltage is increased. This is shown in FIG. 2. More particularly, FIG. 2 illustrates the frequency produced at the output 704 of the voltage controlled oscillator 702 relative to a voltage at the input control node.

The digital clock recovery loop 700 further includes a charge pump and loop filters which control the rate of change of the voltage on the control node of the voltage controlled oscillator. The charge pump and loop filters are designated in FIG. 1 with reference numeral 706.

The digital clock recovery loop 700 further includes a start-up circuit 708 which performs frequency detection when the voltage controlled oscillator first starts up and, in conjunction with the charge pump and loop filters 706, causes the voltage on the control node of the voltage controlled oscillator to change rapidly.

The digital clock recovery loop 700 further includes a state machine 710 which performs phase detection when the frequency of the voltage controlled oscillator is within a few percent of its final value and, in conjunction with the charge pump and loop filters, causes the voltage on the control node of the voltage controlled oscillator 702 to change slowly.

The only analog blocks are the voltage controlled oscillator 702 and the charge pump. The rest of the circuits of the digital clock recovery loop are digital circuits which are easy to build at high yield in integrated circuit processes.

The digital clock recovery loop causes the frequency at the output of the voltage controlled oscillator to vary until a predetermined number of this clock fit within the time interval of an identifiable discrete segment of the incoming data. More particularly, in the illustrated embodiment, the digital clock recovery loop causes the frequency at the output of the voltage controlled oscillator to increase until exactly four cycles of the clock fit within the time interval of a single direct spread spectrum chip. In alternative embodiments, other integer numbers could be used. In the illustrated embodiment, a state machine having four states is employed to cause the frequency at the output of the voltage controlled oscillator to increase until exactly four cycles of the clock fit within the time interval of a single chip.

What follows is a discussion of the operation of each block of the digital clock recovery loop. The start-up circuit 708 is show in FIG. 1.

The start-up circuit 708 includes a plurality of flip-flops 712 chained together, a plurality of flip-flops 714 chained together, and an exclusive-or gate 716. The exclusive-or gate 716 has an output connected to the input of the first of the flip-flops 714, has an input connected to the output of the last of the flip-flops 712, and has another input connected to the input of the same flip-flop 712. More particularly, in the illustrated embodiment, each flip-flop 712 and 714 is a D-type flip-flop and has a D input, a clock input, and a Q output. Other types of flip-flops could be employed. The D input of flip-flops 712 other than the first flip-flop is connected to the Q output of a previous flip-flop 712. The first flip-flop 712 is connected to the input data "Data In." The D input of flip-flops 714 other than the first flip-flop 714 is connected to the Q output of a previous flip-flop 714. The first flip-flop 714 is connected to the output of the exclusive-or gate 716. The clock inputs of the flip-flops 712 and 714 are all tied to the output 704 of the voltage controlled oscillator 702. Data is shifted from the D input of each flip-flop to the Q output of the same flip-flop on each clock pulse. Thus, the flip-flops 712 as a group define a shift register, and the flip-flops 714 as a group define a shift register.

The start-up circuit 708 further includes an AND gate 718 that has one input that is the output of the exclusive-or gate 716, has a second input that is the output of the second of the flip-flops 714, and defines an output "Puf1" (a first pump up fast output). The start-up circuit 708 further includes an AND gate 720 that has one input that is the output of the exclusive-or gate 716, has a second input that is the output of the third of the flip-flops 714, and defines an output "Puf2" (a second pump up fast output).

The start-up circuit 708 further includes a counter 722 that receives as inputs "TX", "Puf1" and "Puf2" and generates an output "SDD" (start data decode) when the output of the voltage controlled oscillator 702 is close to its final value.

Figure 3:
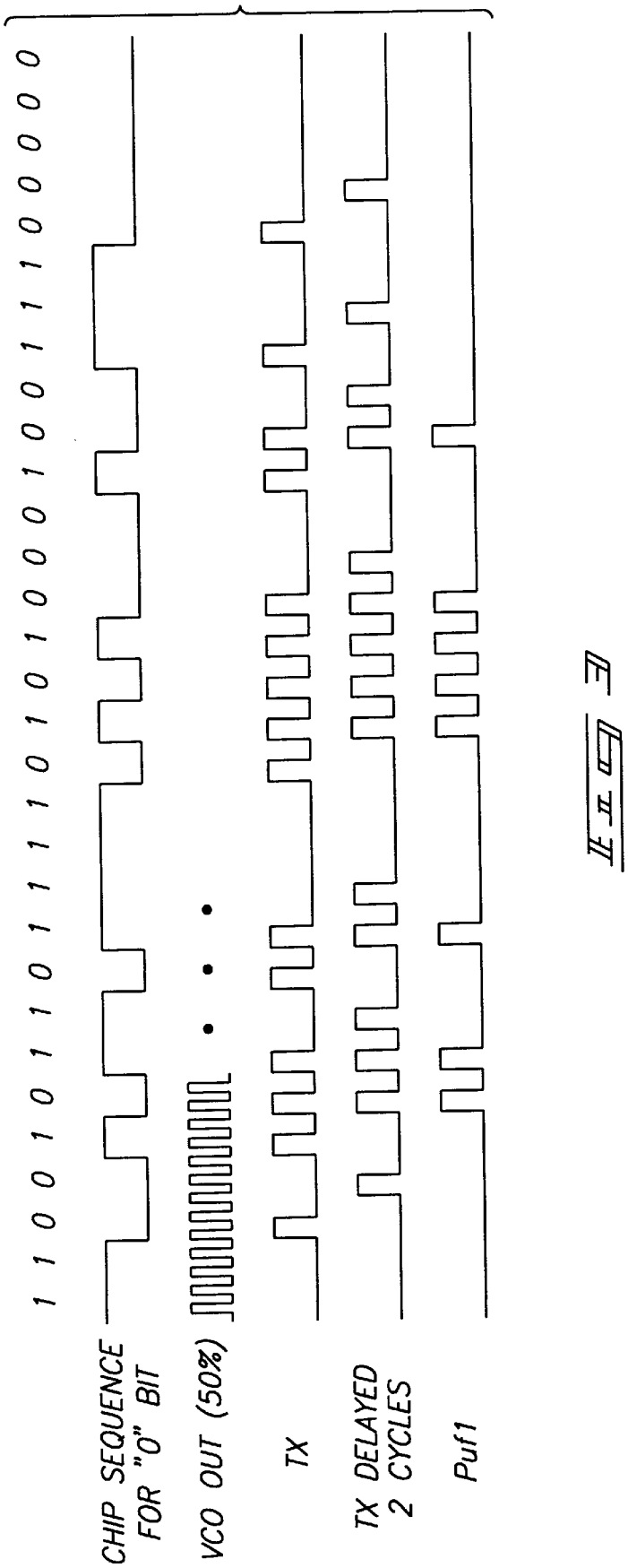
FIG. 3 is a timing diagram showing when the start-up circuit of FIG. 1 issues pump up signals to increase the control voltage applied to the voltage controlled oscillator.

The exclusive-or gate 716 in the center of the page generates a high output whenever there is a transition in the data as sampled by the clock signal output by the voltage controlled oscillator 702 output clock. Assume for discussion that data is latched into all flip-flops 712 and 714 on the falling edge of the clock. Puf2 goes high when three falling edges of the clock occur within one chip because the inputs of the AND gate are spaced apart by three flip-flops. Three falling edges of the clock occur within one chip when the frequency is between 75% and 100% of the final value. Puf1 goes high when two falling edges of the clock occur within one chip because the inputs of the AND gate are spaced apart by two flip-flops. Two falling edges of the clock occur within one chip when the clock frequency is 50% to 75% of its final value. This is shown on the waveform diagram of FIG. 3 for the case when the frequency is exactly 50%. Puf1 could be used to pump up the control node of the voltage controlled oscillator 702 rapidly. Puf2 could be used to pump up the control node of the voltage controlled oscillator 702 at a rate equal to that for Puf1 (as is shown in the figures) or it could pump at a slower rate. As the clock frequency approaches 75% of final in the Puf1 case or 100% of final in the Puf2 case, pump up signals occur infrequently as error must accumulate over a long time to cause the appropriate number of clock edges to shift within a chip. This is used to detect when the clock frequency is close to its final value.

The counter 722 counts transition pulses until it is cleared by a Puf1 or Puf2 signal. If a predetermined large number of transitions are counted before a pump up occurs, a signal is asserted on a line SDD (start data decode). In the illustrated embodiment, if sixteen transitions are counted before a pump up occurs, a signal is asserted on line SDD. This indicates that the voltage on the control node of the voltage controlled oscillator is within a few percent of its final value, allowing data to be accurately recovered.

Figure 4:
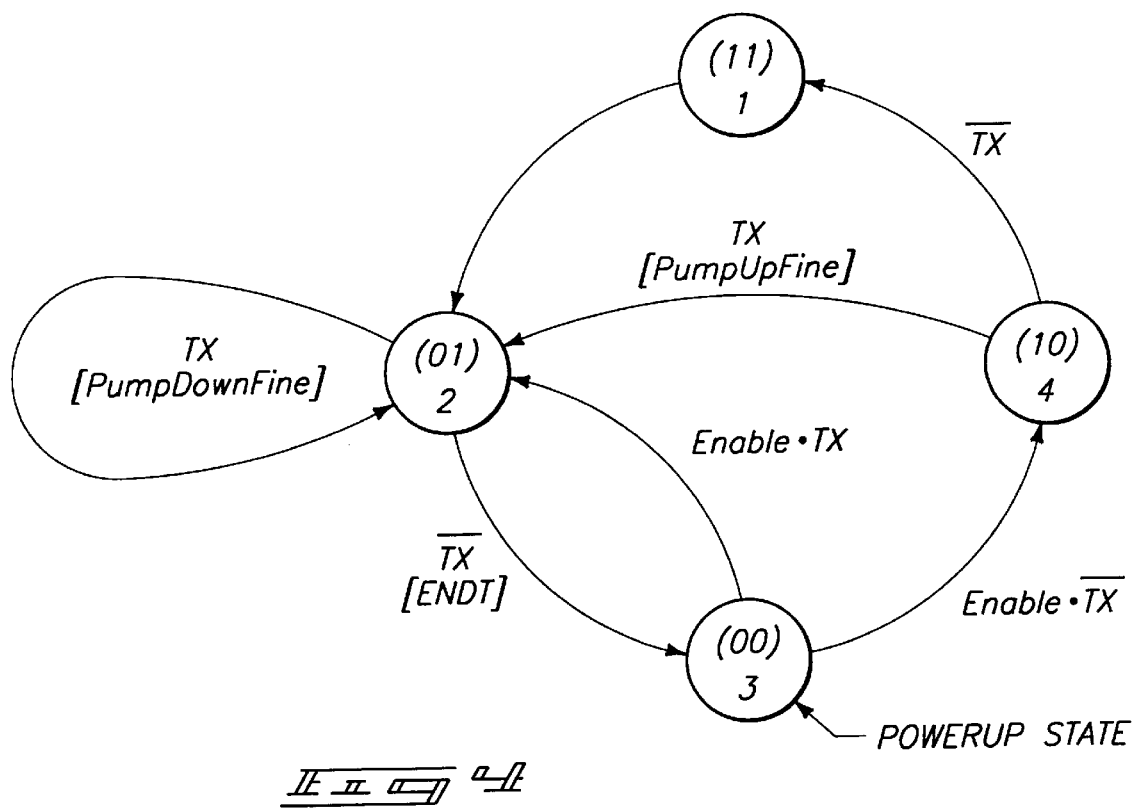
FIG. 4 is a state diagram illustrating the design of the state machine of FIG. 1.

In the illustrated embodiment, the state machine 710 issues finer pump-up signals than the start-up circuit 708, and can also issue pump-down signals. In the illustrated embodiment, the start-up circuit 708 only issues pump up signals. The state machine 710 has as many states as the number of clock cycles which fit within one chip time. In the illustrated embodiment, the state machine has four states. The state machine 710 counts clock pulses and expects the data to transition at a count of one every time there is a transition. If the transition actually occurs at a count of four then the clock is too slow and a pump up is issued. If the transition actually occurs at a count of two then the clock is too fast and a pump down is issued. If the transition actually occurs at a count of three, it is not known whether the clock is fast or slow so no adjustment is made to the voltage controlled oscillator. A state diagram is shown in FIG. 4.

Figure 5:
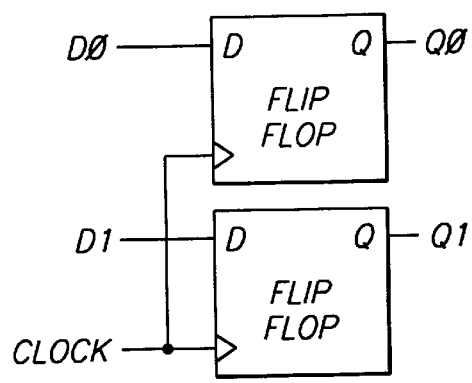

Design of a clocked sequential circuit is known in the art. See, for example, chapter 6 of Digital Logic and Computer Design by M. Morris Mano, 1979, Prentice-Hall, Inc. A typical design procedure involves describing circuit behavior using a state diagram (see FIG. 4), obtaining a state table (see FIG. 6), assigning binary values to each state (see FIG. 4), determining the number of flip-flops needed (see FIG. 5), choosing the type of flip-flops to be used (see FIG. 5), using Karnaugh maps or other simplification methods, deriving circuit output functions and flip-flop input functions (see FIGS. 7 and 8), and drawing the logic diagram. The numbers in parentheses in FIG. 4 are the binary state numbers. ENDT enables the sampling of the data (always at state two when no transition occurred). There are several ways to implement a circuit to perform functions of a state diagram. Assume that Q1 and Q0 are the binary state numbers in parentheses above (Q1 on the left, Q0 on the right), and that D1 and D0 are the next state values of Q1 and Q0, respectively. This is illustrated in FIG. 5. The flip-flop outputs Q0 and Q1 are the states. Then, a state table can be derived. This is shown in FIG. 6. Using Karnaugh maps (see FIGS. 7 and 8), minimum logic to perform the desired function can be derived. It should be noted, of course, that minimum logic need not be employed—logic involving an increased number of logic gates but performing the same desired function can also be employed. From the Karnaugh map shown in FIG. 7, the following equation can be derived:

$$D0=Q1+TX\cdot Q0+En\cdot TX$$

which can also be written as:

$$D0=[Q1'\cdot(TX\cdot Q0)'\cdot(En\cdot TX)']'$$

where the symbol "+" represents a logical OR, the symbol "·" represents a logical AND, and the symbol "'" represents a logical NOT.

From the Karnaugh map shown in FIG. 8, the following equation can be derived:

$$D1=TX'\cdot Q1\cdot Q0'+En\cdot TX'\cdot Q0'$$

which can also be written as:

$$D1=[(TX'\cdot Q0')'\cdot(En\cdot TX'\cdot Q0')']'$$

where the symbol "+" represents a logical OR, the symbol "·" represents a logical AND, and the symbol "'" represents a logical NOT.

Figure 9:
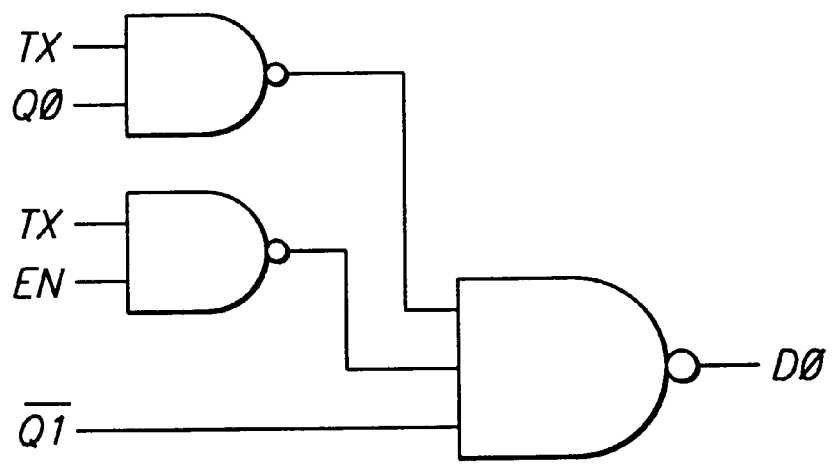
Figure 10:
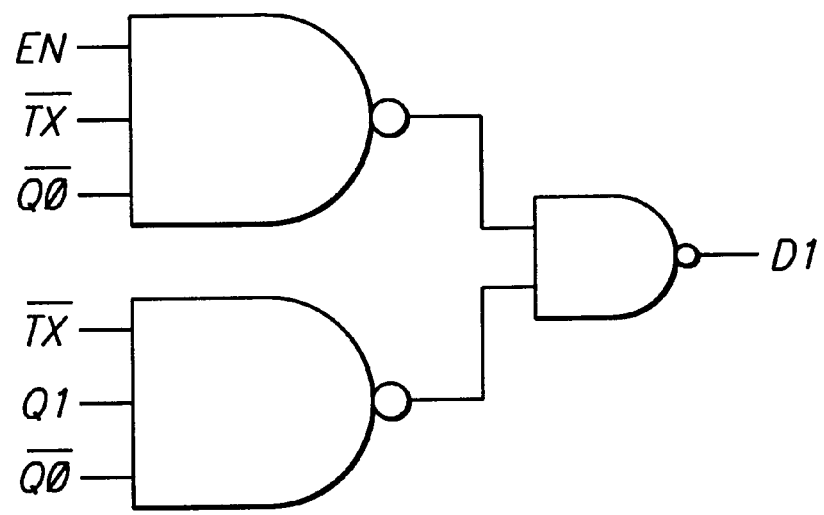

Logic to implement these equations is shown in FIGS. 9 and 10.

Paths shown in FIG. 4 are defined as follows:

$$ENDT=Q1'\cdot Q0\cdot TX'$$

$$PumpUpFine=Q1\cdot Q0'\cdot TX; \text{ and}$$

$$PumpDownfine=Q1'\cdot Q0\cdot TX$$

Figure 11:
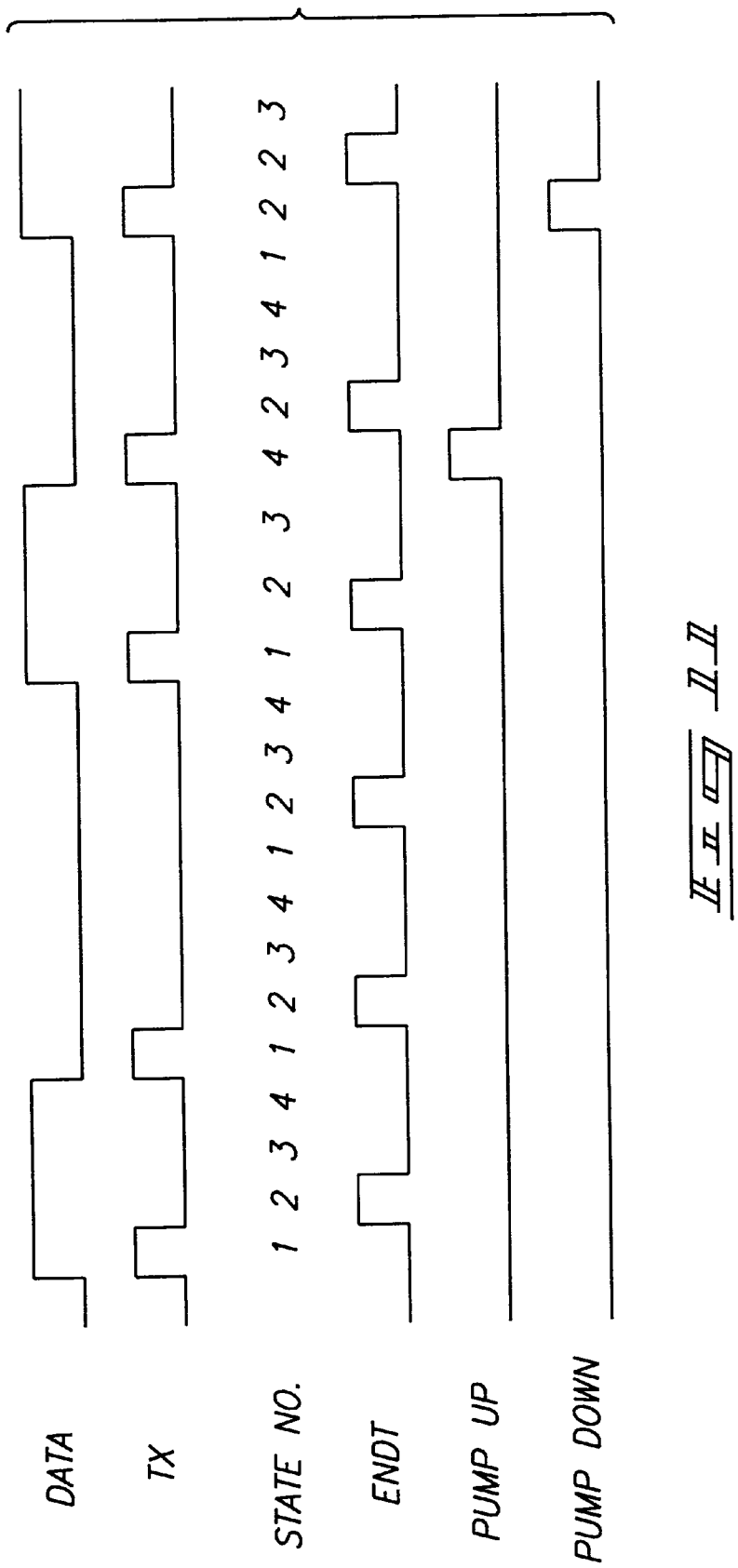
FIG. 11 is a simplified timing diagram illustrating operation of the state machine.

A simplified timing diagram showing operation of the state machine is shown in FIG. 11. The crowding and separation of states in FIG. 11 is exaggerated to show the various modes of operation in a compact form. More particularly, it is highly unlikely that a pump down signal would be necessary so soon after a pump up signal as is depicted in FIG. 11.

The state machine is trying to fit four cycles of the output of the voltage controlled oscillator in one chip width. Referring simultaneously to FIGS. 11 and 4, starting at the first occurrence of state 3 in FIG. 11, there is no transition, so the state machine will proceed to state 4 on the next clock. At state 4, there is no transition, so the state machine will proceed to state 1 at the next clock. At state 1, there is a transition in the waveform. The state machine always proceeds to state 2 from state 1. At state 2, there is no transition. From state 2, the 11 state machine proceeds to state 3. This cycle is repeated and these paths are followed unless the clock recovery loop drifts off frequency.

If the clock recovery loop drifts off frequency, other paths of the state diagram of FIG. 4 are followed. For example, if a transition is seen at state 4, the voltage controlled oscillator is oscillating too slowly, and a PumpUpFine is issued. The state machine skips state 1 and goes to state 2.

If, after going from state 1 to state 2, a transition is seen, the voltage controlled oscillator is oscillating too fast. The state machine will go from state 2 to state 2 so that state 2 is now in the proper position.

If a transition is seen at state 3, the voltage controlled oscillator may either be oscillating too fast or too slowly, so no pump up or pump down signals are issued. Instead, the state machine proceeds to state 2.

The control functions performed by the start-up circuit and state machines can be used to control the frequency of any voltage controlled oscillator.

Figure 13:
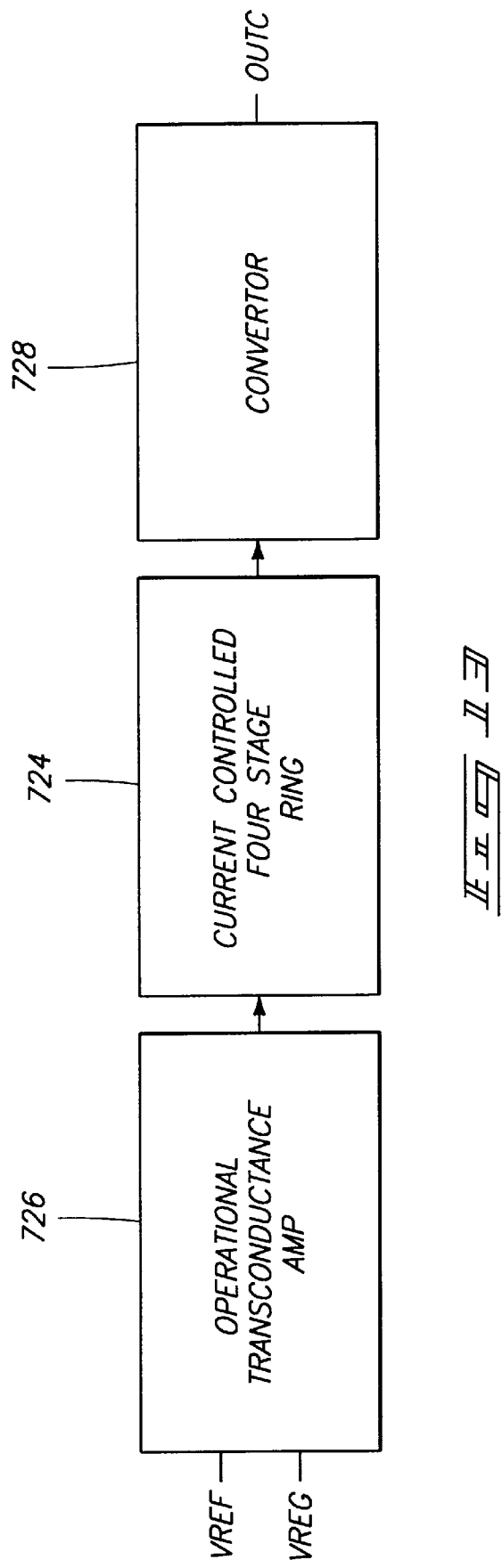
FIG. 13 is a circuit diagram, in block diagram form, of a voltage controlled oscillator.

In the illustrated embodiment, the voltage controlled oscillator 702 includes a current controlled four-stage ring oscillator 724 (FIG. 13). The frequency of oscillation is very much linearly proportional to the bias current flowing in each stage.

The voltage controlled oscillator 702 further includes an Operational Transconductance Amplifier 726 having an output connected to the input of the oscillator 724. This Operational Transconductance Amplifier 726 converts a voltage difference at its inputs to a current difference at its outputs. This Operational Transconductance Amplifier 726 has a characteristic that is linear over a range of input voltage.

The voltage controlled oscillator 702 further includes a convertor 728 that converts small signed outputs of the oscillator 724 to full digital levels.

In one embodiment, the input reference voltage is generated by a bandgap regulator and has a value of about 1.2 volts.

In one embodiment, the start-up circuit requires that the oscillator start at greater than half frequency and less than full frequency over all operating conditions and for all process variations. This oscillator start frequency is set by providing an offset current to the bias of the oscillator which is not controlled by the input voltage.

Figure 14A:
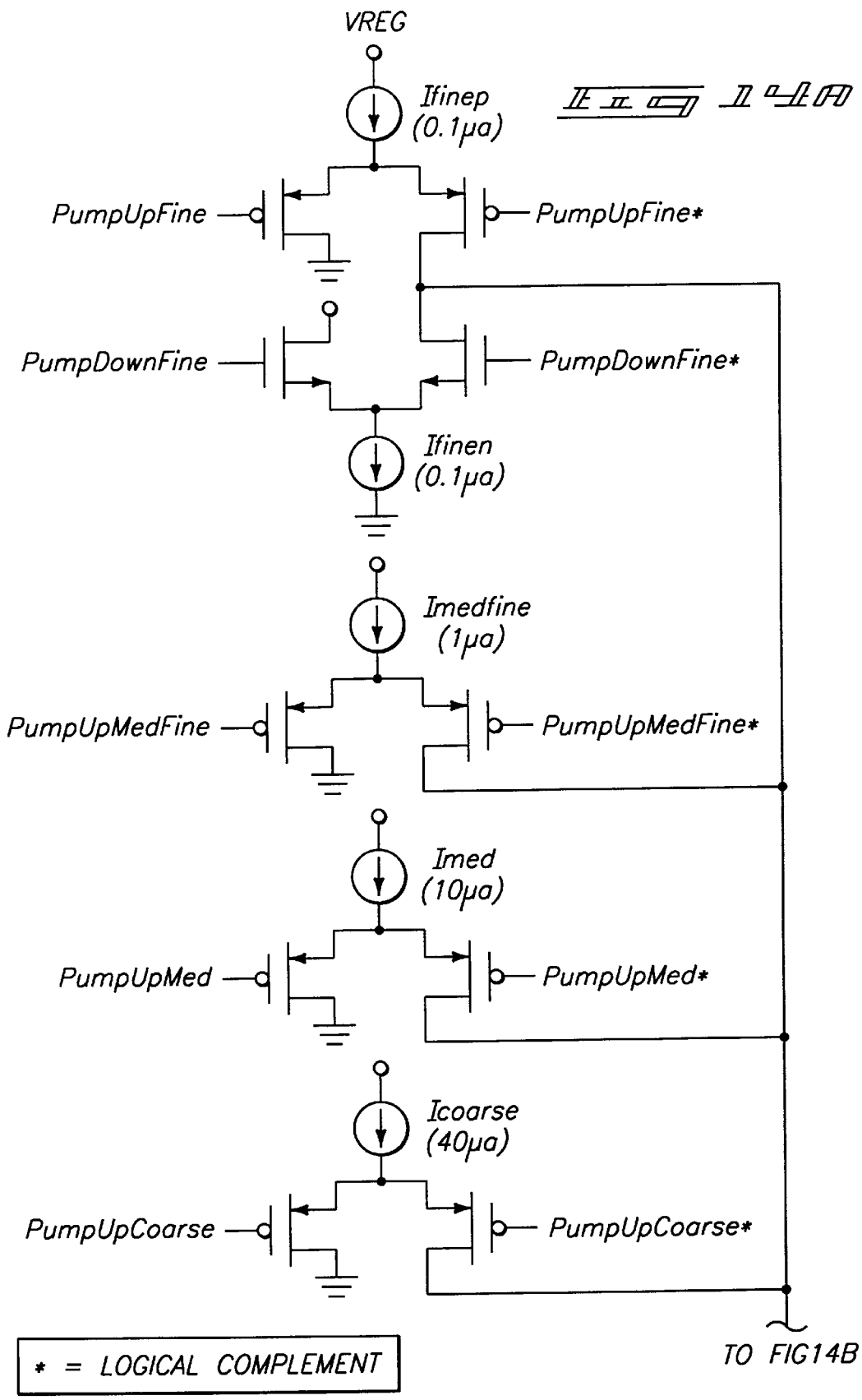
FIGS. 14A and 14B provide a circuit diagram of charge pumps and loop filters.
Figure 14B:
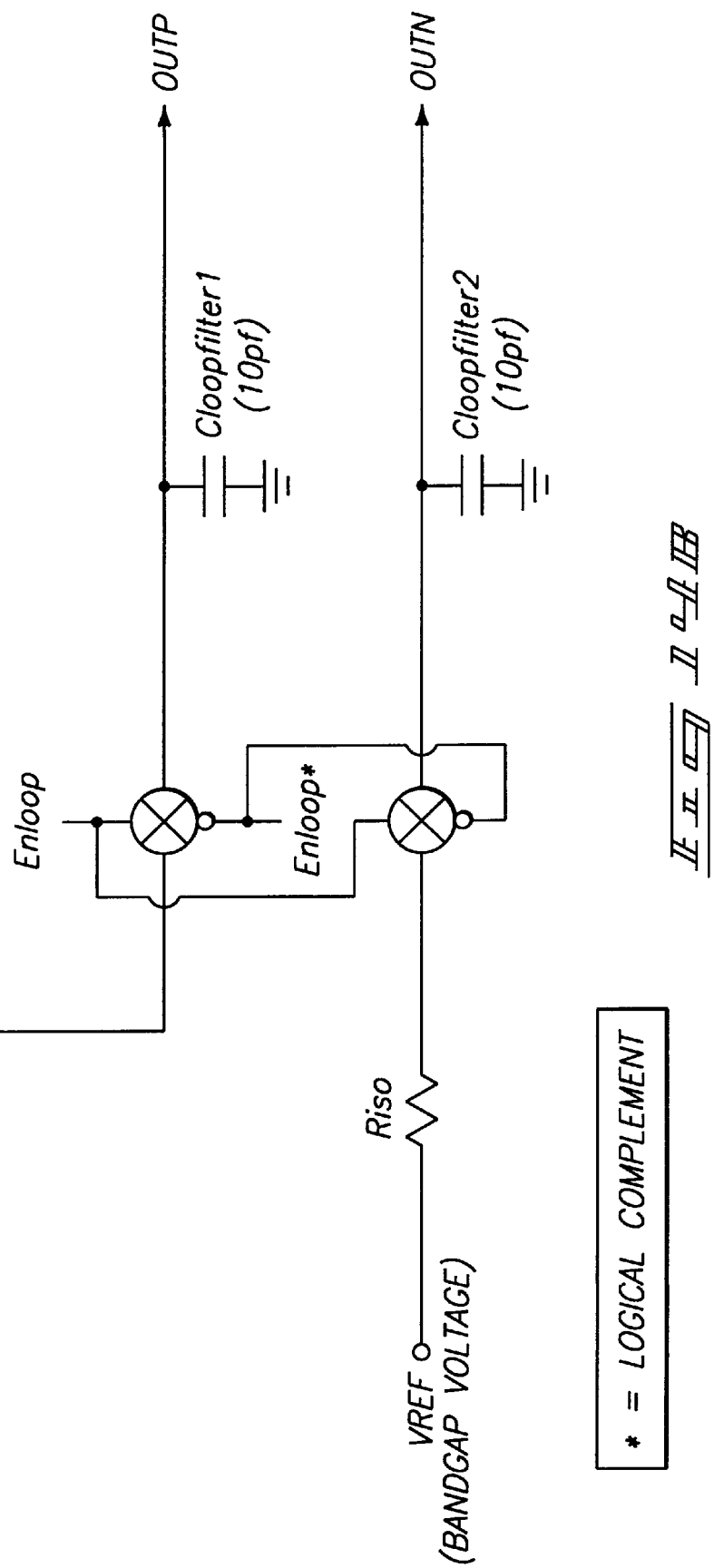

The charge pump and loop filters 706 are shown in greater detail in FIGS. 14A and B. In the illustrated embodiment, the filter S capacitors $C_{loopfilter1}$ and $C_{loopfilter2}$ are connected to the control node inputs "OUTP" and "OUTN" of the voltage controlled oscillator 702. In the illustrated embodiment, the control node always starts at 0 Volts and is pumped up. The other (reference) side is always at the bandgap voltage.

The method employed is to steer a current to charge or discharge a capacitor for a prescribed period of time (one cycle of the recovered clock, in the illustrated embodiment). The change in control voltage for a single pump is:

$$\Delta V = (I/C)\Delta t$$

Figure 12:
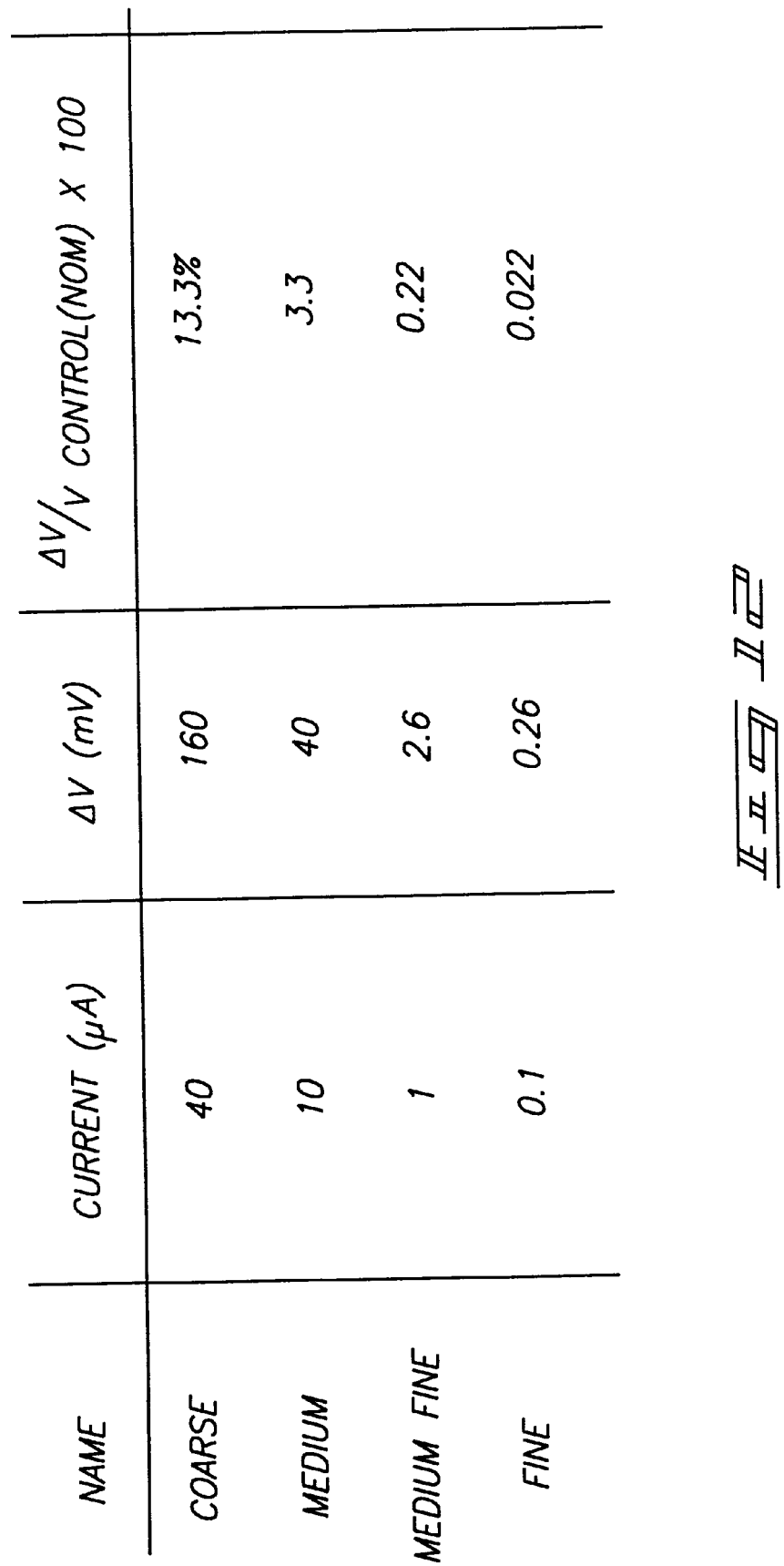
FIG. 12 is a table illustrating step sizes produced by the start-up circuit and the state machine.

In the illustrated embodiment, there are four charge pumps. However, any number of charge pumps can be employed. The lower three of the illustrated charge pumps are controlled by the start-up circuit 708 and can only pump up. The upper pump is controlled by the state machine 710 and can pump up or down in fine steps. The step sizes are controlled by the current value which is set accurately using a bandgap regulator to generate a reference current and using current mirrors to set the pump current. The step sizes used in the illustrated embodiment are shown in FIG. 12. Of course, other step sizes can be employed, as desired, and various numbers of different sized steps can be employed.

The course and medium steps are controlled by the Puf1 and Puf2 outputs of the start-up circuit. The medium fine step is also controlled by the start-up circuit but the step size is reduced when the SDD (start data decode) signal is asserted indicating the oscillator is within a few percent of its final value. The fine step is controlled by the state machine and is used to "close in" on the final value.

While this charge pump and loop filter configuration is advantageous for implementation on an integrated circuit, other configuration are possible. For example, simple RC filters can be employed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A clock recovery circuit configured as a phase lock loop to extract a clock signal from an input digital signal, the clock recovery circuit comprising:
   a voltage controlled oscillator having a control node and having an output configured to produce an output wave having a frequency that varies in response to a voltage applied to the control node;
   charge pump and loop filter circuitry configured to control the rate of change of the voltage on the control node of the voltage controlled oscillator;
   a start-up circuit configured to perform frequency discrimination and, in conjunction with the charge pump and loop filter circuitry, adjust the voltage on the control node of the voltage controlled oscillator; and
   a state machine configured to perform phase control and adjust the voltage on the control node of the voltage controlled oscillator.

2. A clock recovery circuit in accordance with claim 1 and further comprising bias circuitry configured to apply an offset voltage to the voltage controlled oscillator such that, in the absence of any voltage applied to the control node, the frequency of the output wave produced by the voltage controlled oscillator is at least half and not greater than the final frequency of the voltage controlled oscillator when frequency lock is established.

3. A clock recovery circuit in accordance with claim 1 wherein the state machine is configured to make finer adjustments to the voltage on the control node of the voltage controlled oscillator than the start-up circuit.

4. A clock recovery circuit in accordance with claim 1 wherein the start-up circuit is a digital circuit.

5. A clock recovery circuit in accordance with claim 1 wherein the state machine is implemented by digital circuitry.

6. A clock recovery circuit in accordance with claim 1 wherein the input digital signal is direct spread spectrum data including a plurality of chips, and wherein clock recovery circuit is configured to vary the output of the voltage controlled oscillator until a predetermined number of transitions of the output fit within a time interval of a predetermined number of chips in incoming data.

7. A phase lock loop configured to receive an oscillating input signal and produce an output signal, the phase lock loop comprising a plurality of flip-flops which are chained together, the plurality of flip-flops including a first flip-flop having a first output, including a second flip-flop having an input coupled to the first output and having a second output, and including a third flip-flop having an input coupled to the second output, the flip-flops being configured to be used to determine time spacing between transitions to perform a frequency comparison of the output signal relative to the input signal, wherein the input signal is digital and the phase locked loop extracts a clock from the digital signal, the phase locked loop further comprising a control node, and circuitry configured to perform phase control and adjust the voltage on the control node of the voltage controlled oscillator.

8. A phase lock loop in accordance with claim 7 wherein the flip-flops are configured to make adjustments to the voltage on the control node, and wherein the circuitry configured to perform phase control and adjust the voltage on the control node is configured to make finer adjustments to the voltage on the control node of the voltage controlled oscillator than the flip-flops.

9. A phase lock loop configured to receive an oscillating input signal and produce an output signal, the phase lock loop comprising a plurality of flip-flops which are chained together and used to determine time spacing between transitions to perform a frequency comparison of the output signal relative to the input signal, wherein the input signal is digital and the phase lock loop extracts a clock from the digital input signal, the phase lock loop further comprising a control node, and circuitry configured to perform phase control and adjust the voltage on the control node of the voltage controlled oscillator, the phase lock loop further comprising bias circuitry configured to apply an offset voltage to the voltage controlled oscillator such that, in the absence of any voltage applied to the control node, the frequency of the output wave produced by the voltage controlled oscillator is at least half and not greater than the final frequency of the voltage controlled oscillator when frequency lock is established.

10. A communications system including a clock recovery circuit configured as a phase lock loop for extracting a clock signal from incoming digital data, the clock recovery circuit comprising:

a voltage controlled oscillator having a control node and having an output configured to produce an output wave having a frequency that varies in response to a voltage applied to the control node;

charge pump and loop filter circuitry configured to control the rate of change of the voltage on the control node of the voltage controlled oscillator;

a start-up circuit configured to perform frequency discrimination and, in conjunction with the charge pump and loop filter circuitry, adjust the voltage on the control node of the voltage controlled oscillator; and circuitry configured to perform phase control and adjust the voltage on the control node of the voltage controlled oscillator.

11. A communications system in accordance with claim 10 and further comprising bias circuitry configured to apply an offset voltage to the voltage controlled oscillator such that, in operation, in the absence of any voltage applied to the control node, the frequency of the output wave produced by the voltage controlled oscillator is at least half and not greater than the final frequency of the voltage controlled oscillator when frequency lock is established.

12. A communications system including a clock recovery circuit configured as a phase lock loop for extracting a clock signal from incoming digital data, the clock recovery circuit comprising:

a voltage controlled oscillator means having a control node and having an output, for producing a wave at the output having a frequency that varies in response to a voltage applied to the control node;

charge pump and loop filter means for controlling the rate of change of the voltage on the control node of the voltage controlled oscillator;

start-up circuit means for performing frequency discrimination and, in conjunction with the charge pump and loop filter circuitry, for adjusting the voltage on the control node of the voltage controlled oscillator; and state machine means for performing phase control and for adjusting the voltage on the control node of the voltage controlled oscillator.

13. A communications system in accordance with claim 12 and further comprising bias circuitry means for applying an offset voltage to the voltage controlled oscillator such that, in operation, in the absence of any voltage applied to the control node, the frequency of the output wave produced by the voltage controlled oscillator is at least half and not greater than the final frequency of the voltage controlled oscillator when frequency lock is established.

14. A communications system in accordance with claim 12 wherein the state machine means comprises means for making finer adjustments to the voltage on the control node of the voltage controlled oscillator than the start-up circuit.

15. A communications system in accordance with claim 12 wherein the start-up circuit means is a digital circuit.

16. A communications system in accordance with claim 12 wherein the state machine means is implemented by digital circuitry.

17. A communications system in accordance with claim 12 wherein the clock recovery circuit includes mens for varying the output of the voltage controlled oscillator until a predetermined number of transitions of the output fit within a time interval of an identifiable discrete segment of the incoming data.

18. A communications system in accordance with claim 12 wherein the incoming data is direct spread spectrum data including a plurality of chips, and wherein clock recovery circuit includes means for varying the output of the voltage controlled oscillator until a predetermined number of transitions of the output fit within a time interval of a predetermined number of chips in the incoming data.

* * * * *

UNITED STATES PATENT AND TRADEMARK OFFICE
CERTIFICATE OF CORRECTION

PATENT NO.    : 5,982,237
DATED         : November 9, 1999
INVENTOR(S)   : George E. Pax, James E. O'Toole, and Dan M. Griffin It is certified that error appears in the above-identified patent and that said Letters Patent is hereby corrected as shown below:

Column 7, line 3, replace "filter S" with --filter--.

Column 10, line 23, replace "mens" with --means--.

Signed and Sealed this

Seventh Day of November, 2000

Attest:

Q. TODD DICKINSON

*Attesting Officer*        *Director of Patents and Trademarks*